United States Patent [19]

Kaga

[11] Patent Number: 5,059,792
[45] Date of Patent: Oct. 22, 1991

[54] THERMAL FIELD EMISSION ELECTRON GUN

[75] Inventor: Hiroyasu Kaga, Katsuta, Japan

[73] Assignee: Hitachi, Ltd., Tokyo, Japan

[21] Appl. No.: 593,742

[22] Filed: Oct. 5, 1990

[30] Foreign Application Priority Data

Oct. 16, 1989 [JP] Japan .................. 1-268645

[51] Int. Cl.$^5$ .............................................. H01J 37/06
[52] U.S. Cl. ..................................... 250/306; 250/398
[58] Field of Search ................ 250/310, 311, 423 F, 250/398, 306

[56] References Cited

U.S. PATENT DOCUMENTS

| 4,274,035 | 6/1981 | Fukuhara et al. | 250/398 |
| 4,430,570 | 2/1984 | Takigawa et al. | 250/396 R |
| 4,663,525 | 5/1987 | Ohtsuki et al. | 250/310 |
| 4,721,878 | 1/1988 | Hagiwara et al. | 313/362.1 |
| 4,994,711 | 2/1991 | Matossian | 250/423 F |

FOREIGN PATENT DOCUMENTS 62-93848  4/1987  Japan .

Primary Examiner—Bruce C. Anderson
Attorney, Agent, or Firm—Antonelli, Terry, Stout & Kraus

[57] ABSTRACT

A thermal field emission electron gun having a Ti/W chip wherein the fore end of the chip is formed to have a radius of curvature of 2000 Å or above, whereby the drift of the FE noise is small and a lithography apparatus of high serviceability ratio is obtained.

8 Claims, 3 Drawing Sheets

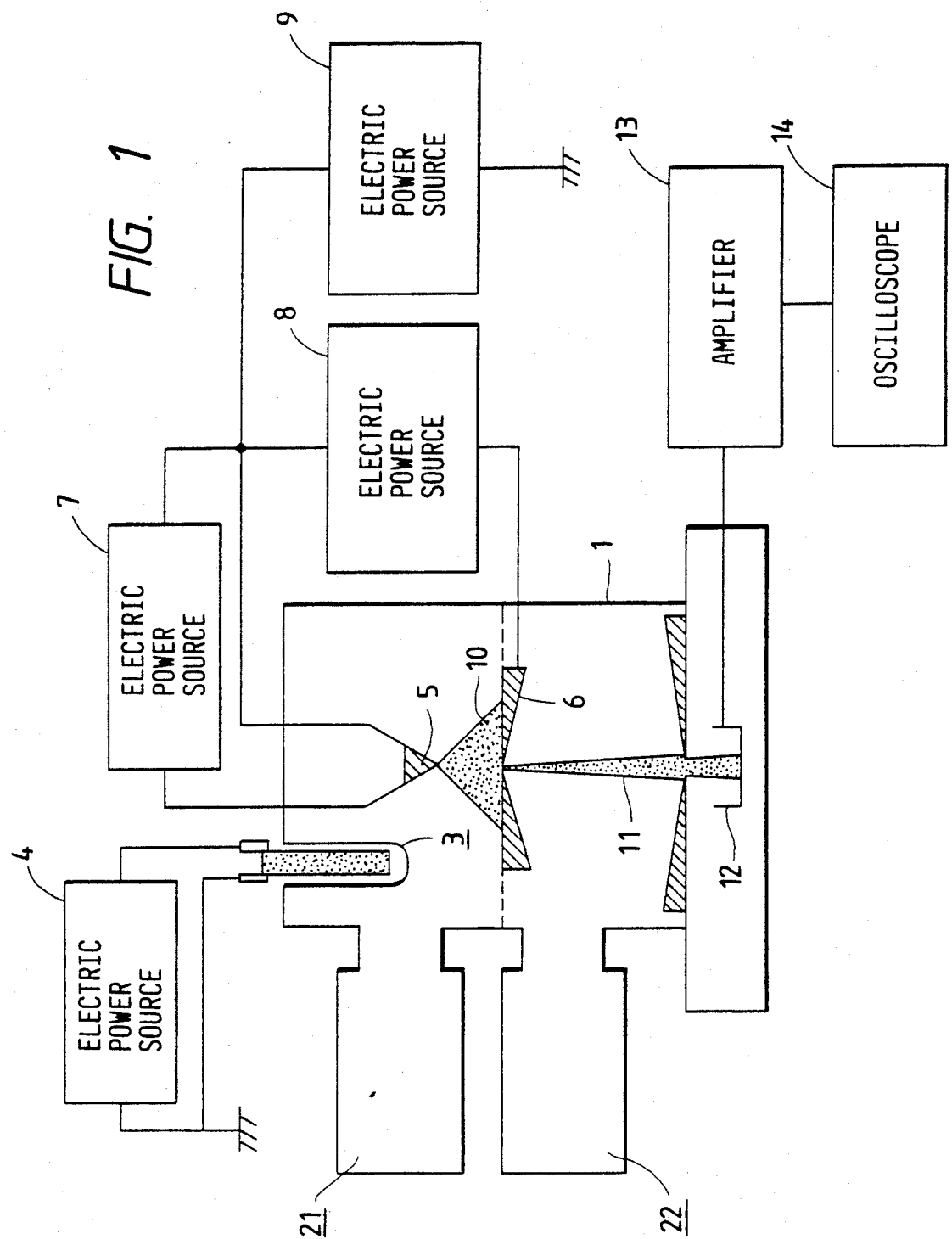

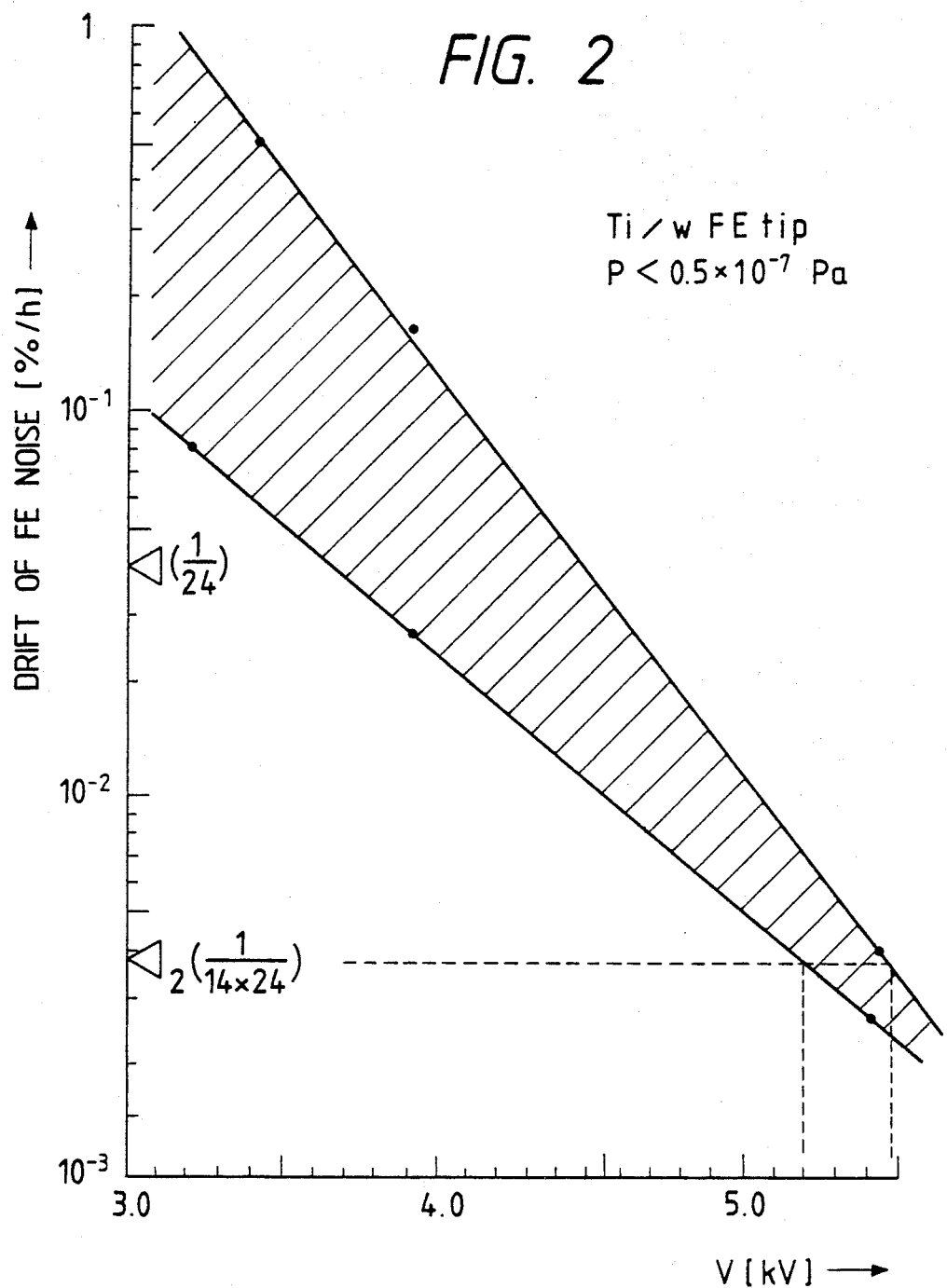

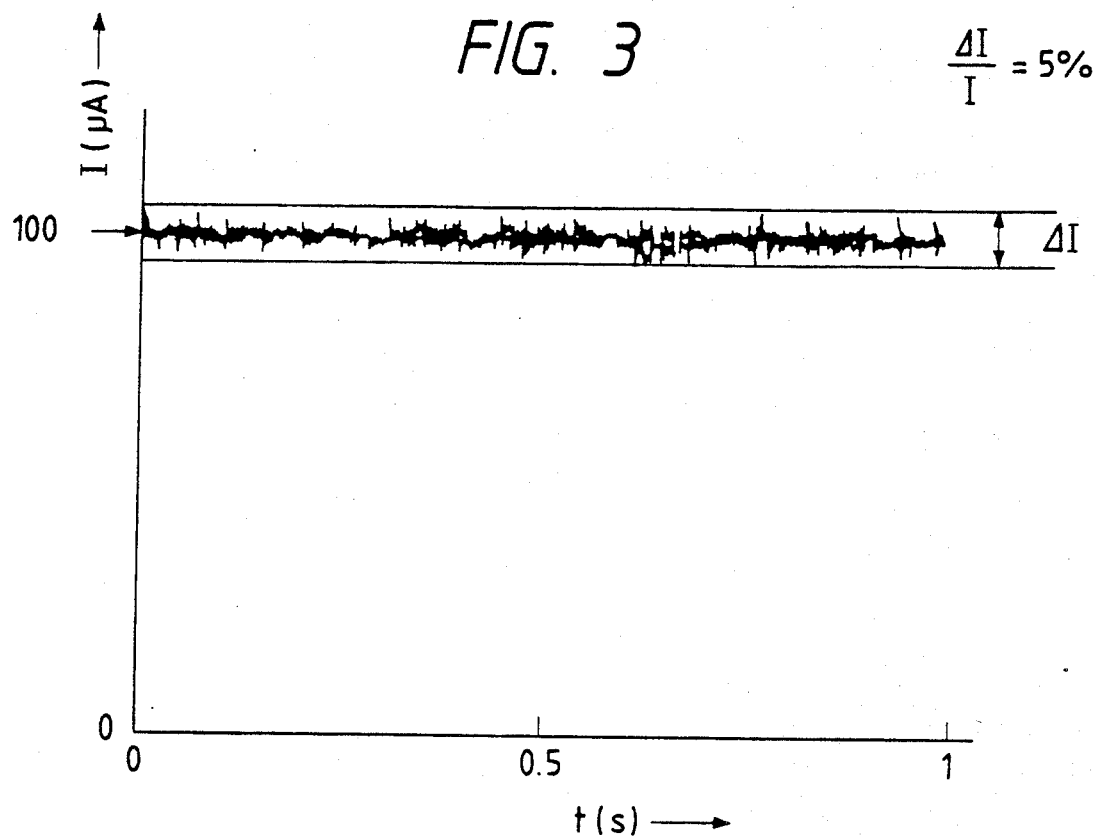
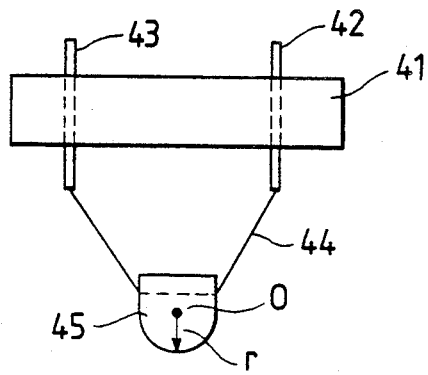

THERMAL FIELD EMISSION ELECTRON GUN

BACKGROUND OF THE INVENTION

The present invention relates to a thermal field emission electron gun and particularly to the electron gun having a thermal field emission cathode whose drift FE (field effect) noise is kept substantially small for a long period.

It has been known that the thermal field emission electron gun shows current fluctuations called FE chip noise, which is peculiar to a field emission cathode. The main purpose of prior-art apparatuses of this kind is observation of an image in SEM or the like generally, and therefore they are so constructed that the strength of an image signal changing with the current fluctuations can be corrected by subjecting an emission current fluctuation and the signal to electrical division. Besides, the image observation in SEM is executed in a cycle of several tens of minutes, and therefore these apparatuses have been employed in their own way without hindrance even when an emission current drift is large. Among generally-known examples relating to this electron gun, there is an example disclosed in Japanese Patent Laid-Open No. 62-93848 (1987), for instance.

Such a cathode employed in SEM or the like as stated above is of a CFE (cold field effect) type, and this cathode of the CFE type has the following problems.

(1) Ion collision due to an electric field
(2) Rise in temperature of a chip and fusion thereof due to emission of a current of high density
(3) Increase in work function due to chip contamination Generally, ultra-high vacuum is maintained for coping with the above problems (1) and (3), and a proper amount of electric field is needed for coping with the above problem (2). However, ion collision energy is in the relation of $E = qv$ (q: electric charge) in the CFE-type cathode, and therefore it increases as the charge $q$ and a lead-out voltage $\underline{v}$ increase. This causes a large chip damage and an increase in a danger of discharge. For this reason, the electron gun using the CFE-type cathode is employed practically in the vacuum of $10^{-7}$ pa or less and with a lead-out voltage $V_l < 5$ kV. Even for the CFEtype cathode having been put to practical use in this way, it is difficult to reduce the FE noise to 15% or below and the drift of the emission current to 10%/hr.

The present invention relates to the electron gun to be used mainly for an electron beam drawing apparatus, and therefore it is demanded that the FE noise itself is small and, besides, the drift thereof and of the emission current is low sufficiently. Accordingly the abovementioned CFE-type cathode is not fit for practical use therefor.

In this regard, a thermal field emission cathode (hereinafter abbreviated as TFE) is employed in the present invention. However, conventional TFE, as it is, has various problems in its application.

TFE using a Ti/W chip, which has been known heretofore, needs to be employed at a high temperature and has complicated structures of a grid and others, which causes difficulty in employment. TFE using a Ti/W chip of relatively low working temperature is unstable in the FE noise and it is difficult to keep the FE noise low stably for a long period.

BRIEF DESCRIPTION OF THE DRAWINGS

FIG. 1 shows one embodiment of an apparatus for measuring the characteristics of an electron gun of the present invention.

FIG. 2 is a graph showing the results of measurement of the characteristics of the electron gun of the present invention.

FIG. 3 is a graph showing one example of FE noise discussed in the present invention.

FIG. 4 is an illustration of a construction of the electron gun of the present invention.

SUMMARY OF THE INVENTION

An object of the present invention is to furnish an electron gun having a thermal field emission cathode which makes it possible to keep a state of emission with reduced FE noise unvaried for a long period with a drift lessened. In order to solve the above-mentioned problems, in the present invention, the shape of a ship of the thermal field emission cathode was analyzed experimentally, and based on the analysis, the radius of curvature of the fore end of the chip of the cathode was made larger than usual so as to reduce considerably a change in an emission current density. In other words, it was found that an excellent effect could be obtained by constructing a Ti/W chip so that the radius of curvature was 0.2 microns or above.

Considering that the radius r of curvature in this case was an extremely small value of a sub-micron order and thus hard to measure actually, and utilizing that a leasout voltage V and the radius r of curvature are in the proportional relationship under the condition of a fixed electric field F, the relationship between the lead-out voltage V in a fixed emission current and the FE noise caused by the change in the emission current and the FE noise caused by the change in the emission current density was measured in the present invention.

On the assumption that the drift of the FE noise for practical use was 1%, the radius r of curvature making it possible to hold down the drift to be 1% or below was measured with the lead-out voltage V varied and the radius r of curvature was determined from this lead-out voltage V. As the result, it was found that $r < 0.2$ microns was sufficient in the case of the Ti/W chip.

DETAILED DESCRIPTION OF THE PREFERRED EMBODIMENTS

A structure of the thermal field emission cathode employed for the present invention is illustrated in FIG. 4. Electrodes 42 and 43 are provided in a base 41 having an electrically insulation property and resistance to high temperature, and a Ti/W chip 54 is heated by heating a filament 44. The fore end of the chip 45 has a radius r of curvature around a point O.

Such a chip of a TFE type as the above has inherent high-frequency noise being called FE noise and so large as 10 KHz, and when the drift of this FE noise is large, an electric charge accumulated in a resist becomes different according to places. Consequently, there occurs a problem of non-uniformity in does even when a drawing area is desired to be exposed uniformly. Since the amount of decrease of a resist film has a relation with the amount of dose, on the other side, it is hard to conduct drawing in a prescribed line width at high speed by this cathode, which results in a worse yield in a drawing apparatus for manufacture of a device such as a memory and also the difficulty in high-precision manufacture.

In order to solve these problems, accordingly, the shape of the chip of the thermal field emission cathode was changed and the relationship between the radius of curvature of the fore end of the chip of the cathode and the emission current density was analyzed experimentally.

The radius r of curvature, however, is an extremely small value of a sub-micron order and thus hard to measure actually. It was decide, accordingly, to measure the relationship between the lead-out voltage V in a fixed emission current and the FE noise caused by a change in the emission current density by utilizing that the leadout voltage V and the radius r of curvature are in a proportional relationship under the condition of an electric field F being fixed.

One embodiment of an apparatus for determining experimentally the structure of the electron gun in the present invention will be described hereunder with reference to FIG. 1. Ion the electron gun, and the degree of vacuum is set to be $0.2 \times 10^{-7}$ Pa or below by baking and the like. In addition, a cylindrical pipe 3 formed of silver is fitted to the electron gun chamber 1 and an internal heater is provided so that oxygen in the external air can be introduced into the electron gun chamber 1 by heating the silver pipe 3 by an electric power source 4 for the internal heater. Moreover, a Ti/W chip 5 was fitted as a cathode to the electron gun chamber 1 and the electron gun constructed of an electrostatic lens 6 of a Butler type is constructed.

The Ti/W chip was heated to 1300° C. by an electric power source 7 for a filament of the chip 5 and subjected to an emission control by electric power sources 8 and 9. Formation of the radius of curvature of the Ti/W chip was controlled by utilizing a fact that a specific surface of the chip is turned protuberant (a plane of a small plan radius of curvature of each face turns protuberant) when the chip is heated with a prescribed strong electric field F applied thereto invariably, while the original plane radius of curvature and further the radius of curvature become large when this chip is heated with the electric field F excluded, to the contrary.

An emission current 10 from the Ti/W chip 5 was restricted by the electrostatic lens 6 and an emission current 11 was detected on the downstream side by a beam monitor 12 shaped in a Faraday cage. The detected current 11 was led outside the vacuum through a hermetic seal, amplified to be in a frequency band of 30 KHz or above and to have an amplification rate multiplied by $10^{-7}$ by a high-speed amplifier 13 and displayed in an oscilloscope 14 of 10 MHz. The results were photographed periodically and a change with time of the FE noise of the long-term emission current was measured.

The lead-out voltage needed for obtaining an emission current I=100 A from the Ti/W chip was examined with respect to the relationship between the lead-out voltage and the Fe noise by using a plurality of cathodes having various radiuses of curvature as experimental materials. The results of measurement obtained when the FE noise itself is 5% are shown in FIG. 3. It should be noted herein that the current was amplified to be in an amplified band of 33 KHz and to have an amplification rate multiplied by $10^{-7}$ and then photographed in the oscilloscope of which the division of a scan speed was set to be 0.1 second/division (S/div.), and that the FE noise was defined as $\Delta I/I$ to be obtained by measuring a change in the photograph on a peak-to-peak basis through 10 divisions ($\Delta I$) and by dividing the result by a level I. The drift of such FE noise (e.g. 5%) as the above is taken into account in the present invention.

The time required for the FE noise controlled to be as low as 5% in the initial state to increase by 1% in drifting was taken as a rate of increase of the FE noise, and the drift of the FE noise was taken on the vertical axis and the lead-out voltage on the horizontal axis. The results of measurement thus executed are shown in FIG. 2.

In an electron beam drawing apparatus for drawing on a semiconductor wafer, or the like, the FE noise is hard to correct and a continuous operation for two weeks (2 W) or longer is necessitated for increasing the serviceability ratio of the apparatus. Besides, axial adjustment accompanying a process to reduce the FE noise and further drawing adjustment are necessitated. For these reasons, it is requisite that the state of the low FE noise can be maintained for as long a period as possible. In order to attain high stability, high precision and a high serviceability ratio, accordingly, the rate of increase of the FE noise needs to be 1%/2 W for practical use.

It is seen from FIG. 2 that the voltage enabling attainment of the increase rate of 1%/2 W is about 5 kV.

It is known generally, on the other side, that the electric field F is approximated by the following formulas. The radius of curvature of the chip is determined by using these formulas.

$$\oplus \approx 1/5r \quad \ldots (1)$$

$$F = \beta V \quad \ldots (2)$$

Herein r denotes the radius of curvature and $\beta$ a form factor.

When the radius r of curvature of the cathode under the condition of the electric field $F = 5 \times 10^7$ (V/cm) with which a field emission begins is determined from the formulas (1) and (2) with a work function fixed, it is as in the following table in relation to each lead-out voltage.

| V(kV) | r (Å) |
|---|---|
| 3 | 1200 |
| 4 | 1600 |
| 5 | 2000 |
| 6 | 2400 |

It is seen from FIG. 2 that the above-stated increase in the FE noise is held down to 1%/2W by the lead-out voltage of 4 kV or above and by the chip whose radius r or curvature is about r=2000 Å or above. When a chip having the radius r of curvature of 2000 Å or above was employed as the chip of the thermal field emission cathode in the present embodiment according to the results of the experiment described above, the drift of the FE noise was small and a lithography apparatus of high serviceability ratio and stability was obtained successfully.

According to the present invention, as described above, the change with time of the FE noise was held down to be small successfully by using the Ti/W chip as the chip of the thermal field emission cathode and by making the radius of curvature of the fore end thereof as large as 2000 Å or above.

I claim:

1. In an electron gun having a thermal field emission cathode having a Ti/W chip and first and second anodes which are disposed opposite to said cathode and whereon a lead-out voltage and an acceleration voltage are applied, a thermal field emission electron gun wherein the fore end of the aforesaid Ti/W chip is formed to have a radius of curvature of 2000 Å or above.

2. A thermal field emission electron gun according to claim 1, wherein drawing is made on a wafer by an electron beam led out of the aforesaid cathode.

3. A thermal field emission electron gun according to claim 1, wherein the aforesaid lead-out voltage is set to be 5 kV or above in use.

4. A thermal field emission electron gun according to claim 3, wherein drawing is made on the wafer by the electron beam led out aforesaid cathode.

5. A thermal field emission electron gun comprising,
a thermal field emission cathode having a Ti/W chip,
a first anode which are disposed opposite to said cathode and whereon a lead-out voltage are applied, and
a second anode which are disposed opposite to said cathode and whereon an acceleration voltage are applied, wherein the fore end of the aforesaid Ti/W chip is formed to have a radius of curvature of 2000 Å or above.

6. A thermal field emission electron gun according to claim 5, wherein drawing is made on a wafer by an electron beam led out of the aforesaid cathode.

7. A thermal field emission electron gun according to claim 5, wherein the aforesaid lead-out voltage is set to be 5 kV or above in use.

8. A thermal field emission electron gun according to claim 7, wherein drawing is made on the wafer by the electron beam led out aforesaid cathode.

* * * * *